United States Patent [19]
Granger et al.

[11] Patent Number: 5,458,725
[45] Date of Patent: Oct. 17, 1995

[54] GAS DISTRIBUTION SYSTEM

[75] Inventors: George F. Granger, Mesa; Howard Ng, Phoenix, both of Ariz.

[73] Assignee: Motorola, Inc., Schaumburg, Ill.

[21] Appl. No.: 107,089

[22] Filed: Aug. 17, 1993

[51] Int. Cl.⁶ ........................................................ B05C 5/00
[52] U.S. Cl. ................... 156/345; 156/640.1; 156/646.1; 118/715
[58] Field of Search ..................................... 156/345, 640, 156/646; 118/715, 723 E; 134/902, 31

[56] References Cited

U.S. PATENT DOCUMENTS 5,211,825  5/1993  Saito et al. ......................... 156/345 X

OTHER PUBLICATIONS

The Precision Etch 8300/8300A Process Chamber Module Study Guide, 1987 Applied Materials, pp. 30–32.

Primary Examiner—Thi Dang
Attorney, Agent, or Firm—William E. Koch

[57] ABSTRACT

An improved gas distribution system (10) is provided. The system reduces the number of particles settling on semiconductor wafers (38, 40, 42) during processing. The system includes gas tubes (44, 46, 48, 50) having gas inlets (52, 54, 56, 58, 60, 62). The gas inlets are offset from the center line (74, 76) of corresponding wafers, and offset from the inlets of neighboring gas tubes. The inlets are also directed along lines (90, 92, 94, 96) which do not intersect corresponding wafers (38, 40, 42). The gas tubes (44, 46, 48, 50) each include a removable cap (110) to provide easy cleaning. Additionally, the gas tubes (44, 46, 48, 50) each include an alignment slot (114) for accurate alignment of the tube and inlets.

6 Claims, 3 Drawing Sheets

GAS DISTRIBUTION SYSTEM

BACKGROUND OF THE INVENTION

The present invention relates, in general, to semiconductor processing systems, and more particularly, to improved gas distribution systems for semiconductor processing systems.

Many semiconductor processing systems require the distribution of gas within a processing chamber. For example, in the case of reactive ion etching (RIE), gas is typically distributed inside a low pressure chamber. With RF energy, the gas is converted to a plasma which is capable of etching semiconductor material such as nitrides and oxides, and in some cases metals which have been formed on the semiconductor material.

The semiconductor material within the semiconductor processing system usually takes the form of semiconductor wafers. A parameter of particular concern, during the processing of semiconductor wafers, is the number of microscopic particles which adhere to the wafer during processing. The particles are detrimental to processing because they can prevent the semiconductor device from being properly formed. Consequently, the particles negatively impact yield.

It has been determined that the manner in which gas is distributed in a semiconductor wafer processing system can significantly effect the particle contamination of the semiconductor wafers in the system. In the past, gas has been distributed in the processing system via gas tubes which have pin sized gas inlet holes aligned to and directed generally toward the wafers in the system. It has been determined that gas distributed directly at the wafer increases the probability of particles settling on the wafer. Additionally, in the past, gas inlet holes of adjacent gas tubes within the system have been located in opposing positions, causing a resultant gas flow which is directed toward the wafers. It has been determined that this condition also increases the probability of particles adhering to the wafers.

An additional problem presenting itself in the conventional gas distribution system is the difficulty of cleaning the gas tubes. In the past, the gas tubes have had a cap permanently fixed to one end. Consequently, nothing could be passed completely through the tube for cleaning. Furthermore, it is impossible to see into the tube for cleaning.

What is needed is an improved gas distribution system which causes gas to flow in an optimal configuration in order to minimize the number of particles settling on the semiconductor wafer surface. Additionally, it would be desirable to provide gas tubes which are easily cleaned. Furthermore, it would be desirable to provide a gas tube which can be conveniently installed in the system so that gas inlets are properly aligned.

SUMMARY OF THE INVENTION

Briefly stated, the present invention provides an improved gas distribution system. Generally, the system comprises at least one semiconductor wafer receiving area which has a center line. The wafer receiving area lies in a first plane. Additionally, the system comprises a first gas tube lying in a second plane which is parallel to the first plane. The first gas tube has at least one gas inlet corresponding to the wafer receiving area. The gas inlet is offset from the center line of the wafer receiving area. Furthermore, the system comprises a second gas tube which lies in a third plane that is also parallel to the first plane. The second gas tube comprises at least one gas inlet corresponding to the wafer receiving area. The gas inlet of the second gas tube is offset from the center line of the wafer receiving area and also offset from the corresponding gas inlet of the first gas tube.

DETAILED DESCRIPTION OF THE DRAWINGS

Figure 1:
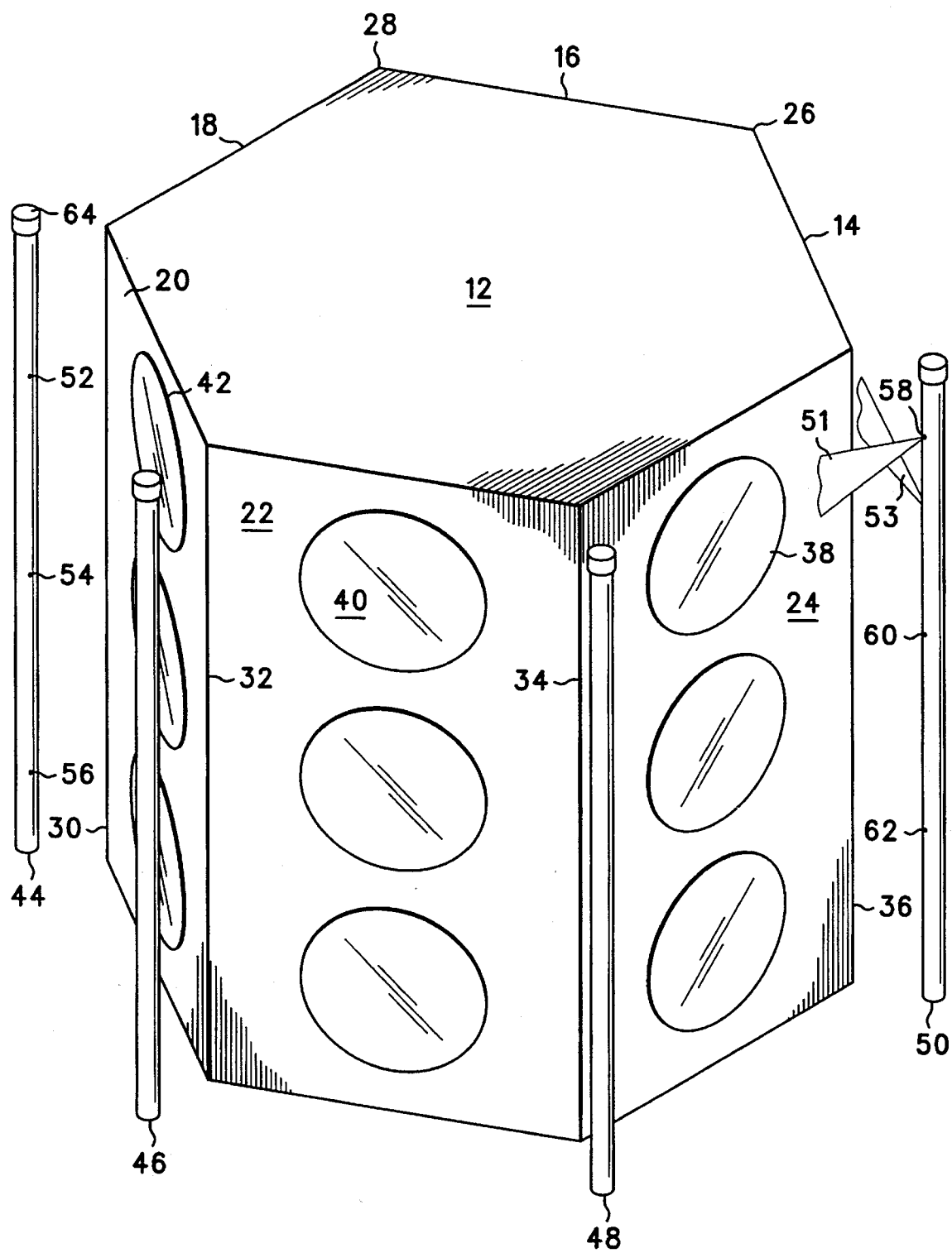
FIG. 1 is a perspective view of a semiconductor wafer processing system which employs an improved gas distribution system in accordance with the present invention.

FIG. 1 is a perspective view of a semiconductor wafer processing system which employs an improved gas distribution system in accordance with the present invention. In the preferred embodiment, semiconductor wafer processing system 10 is a reactive ion etching system. A suitable system is Applied Materials™ 8110 reactive ion etcher. Although the 8110 holds four wafers per side, the drawings show three wafers per side for simplicity. The improved gas distribution system is suitable for other Applied Materials™ 8000 series etchers as well. The preferred 8110 is a low pressure oxide and nitride etcher. It will be understood, that although not shown, the components of the system reside within a low pressure chamber covered by a belljar.

The wafer processing system 10 comprises wafer holding member 12. Wafer holding member 12 is hexagonal in shape, comprising six sides, 14, 16, 18, 20, 22 and 24. Each pair of sides defines an edge, 26, 28, 30, 32, 34 and 36, respectively. Up to three wafer receiving areas are shown for holding semiconductor wafers to be processed, represented by wafer receiving areas 38, 40 and 42.

A gas tube is disposed near each edge, where two sides meet. Gas tubes 44, 46, 48 and 50 are shown. Gas tubes 44, 46, 48 and 50 correspond to edges 30, 32, 34 and 36, respectively. The gas tubes corresponding to edges 26 and 28 are hidden in the view of FIG. 1. Each gas tube comprises at least one gas inlet hole corresponding to each wafer receiving area on the sides defining the edge near the gas tube. The pin size gas inlets are represented by inlets 52, 54 and 56, with respect to tube 44, and inlets 58, 60 and 62, with respect to tube 50. As an example, hole 52 corresponds to wafer receiving area 42. Similarly, hole 58 corresponds to wafer receiving area 38. Although hidden in the view of FIG. 1, the tubes 44 and 50 have similar inlets corresponding to wafers on sides 18 and 14, respectively. Each of the tubes of the preferred system are configured in a like manner.

The gas inlets are for directing the flow of gas into the system. The gas is emitted from the inlets in a flow, as illustrated by gas streams 51 and 53. As explained in more detail below, the location and direction of the gas streams directly effects the number of particles tending to adhere to the wafers being processed. Although not shown, the particular gas required for the particular etch process is fed to the gas tubes from an external source, through the bottom of the gas tube.

Each gas tube also comprises a removable cap at a first end, which is its top end. The removable caps are represented by cap 64 on gas tube 44. The details of the removable caps are discussed below.

Figure 2:
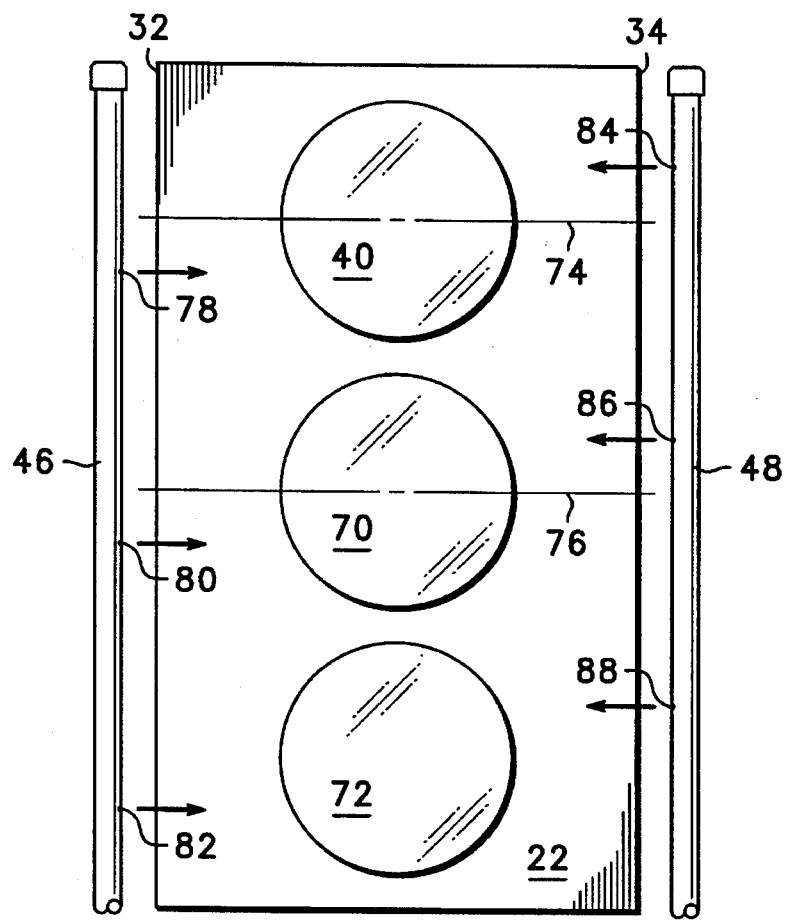
FIG. 2 is a side view of the system of FIG. 1.

FIG. 2 is a side view of a portion of the system shown in FIG. 1. More specifically, FIG. 2 illustrates the position relationship of the gas inlet holes relative to one another and relative to the wafer receiving areas on a side of the wafer holding member. FIG. 2 shows side 22 having three wafer receiving areas, 40, 70 and 72. Additionally, FIG. 2 shows gas tube 46 near edge 32 and gas tube 48 near edge 34.

Wafer receiving areas 40, 70 and 72 each comprise center lines. Center lines 74 of wafer receiving area 40 and center line 76 of wafer receiving area 70 are shown for illustration. Areas 40, 70 and 72 are preferably suitable for holding 100 mm (four-inch) silicon wafers, but are capable of holding a variety of wafer sizes. The wafer receiving area center lines, illustrated by center lines 74 and 76, are 114 mm (four and one-half inches) apart in the preferred embodiment.

Gas tubes 46 and 48 each comprise a gas inlet corresponding to each wafer receiving area. The horizontal arrows indicate the location and direction of the pin sized gas inlets. Specifically, in connection with gas tube 46, inlets 78, 80 and 82 correspond to wafer receiving areas 40, 70 and 72, respectively. In connection with gas tube 48, inlets 84, 86 and 88 correspond to wafer receiving areas 40, 70 and 72, respectively.

The gas inlets are offset from the center lines of the corresponding wafer receiving areas. Specifically, in the preferred embodiment, the gas inlets of gas tube 48 are offset 25 mm (one inch) above the center lines of the corresponding wafer receiving areas. Additionally, the gas inlets of gas tube 46 are offset 25 mm (one inch) below the center lines of the corresponding wafer receiving areas. Furthermore, this arrangement implies that the gas inlets of gas tube 48 are offset from those of gas tube 46, 50 mm (two inches) above the gas inlet holes of gas tube 46.

The gas inlets are offset from the center line of the corresponding wafers in order to minimize the amount of gas stream which directly crosses the wafer in the receiving area. This has been determined to decrease the number of microscopic particles which adhere to the wafer. Additionally, the gas inlets of opposing gas tubes, for example gas tubes 46 and 48, are offset from one another so that their gas streams do not directly meet. This also decreases the number of particles adhering to the semiconductor wafer during processing.

Referring briefly back to FIG. 1, it should be understood that each set of opposing gas inlets is offset in the way that inlets 78, 80 and 82 are offset from inlets 84, 86 and 88, shown in FIG. 2. Referring to FIG. 1, gas inlets 52, 54 and 56 are 50 mm (two inches) lower than the hidden inlets of gas tube 46 which face inlets 52, 54 and 56. Similarly, the hidden inlets of gas tube 46 which face gas tube 48 are 50 mm (two inches) lower than the corresponding inlets on gas tube 48. Likewise, the hidden inlets of gas tube 48 which face gas tube 50 are 50 mm (two inches) lower than inlets 58, 60 and 62 of gas tube 50. This relationship continues throughout all of the gas tubes of the system. It should be understood the exact amount of offset depends upon the particular wafer size, and will be correspondingly larger for larger wafers, for example.

Figure 3:
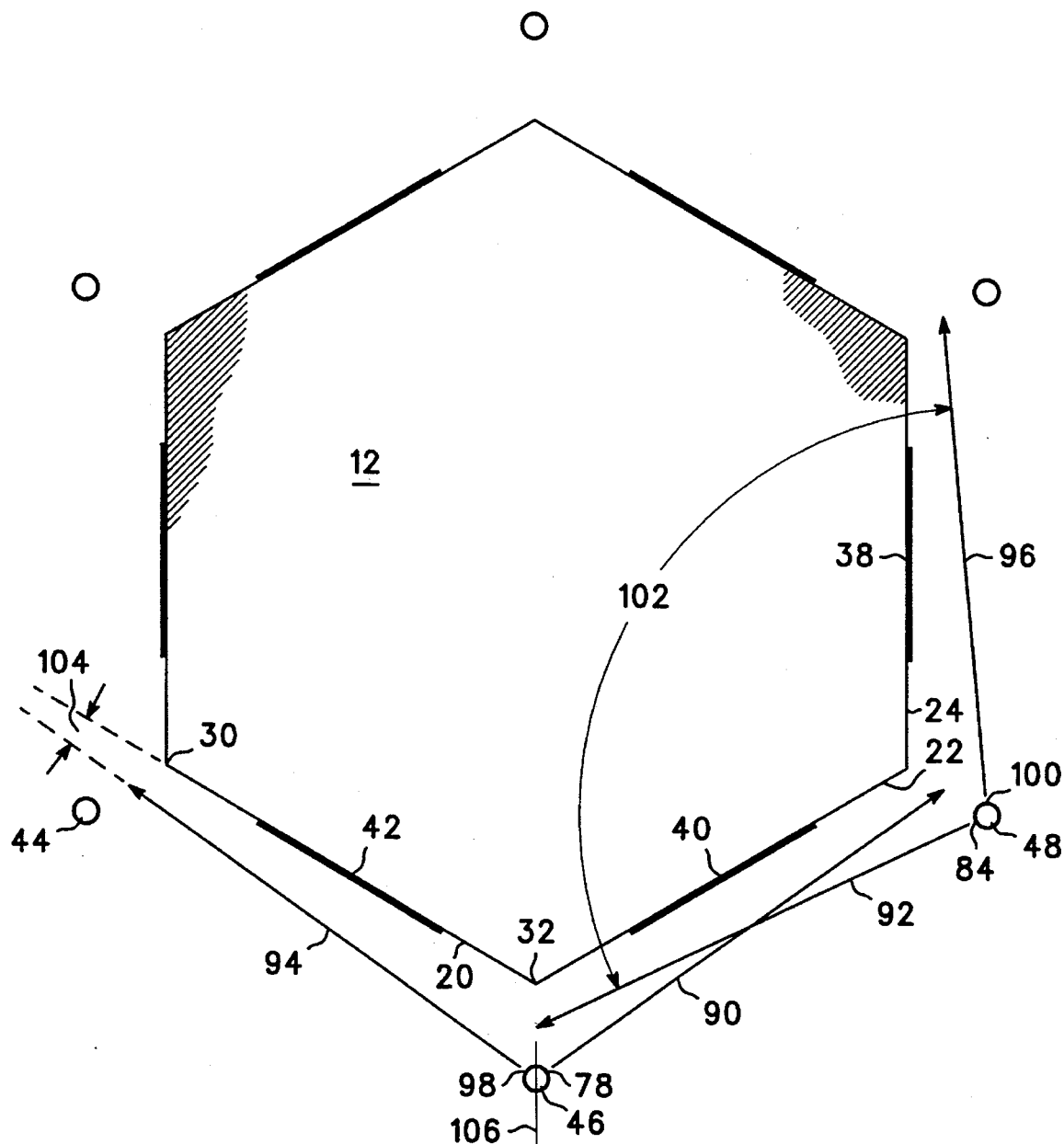
FIG. 3 is a top view of the system of FIG. 1.

Whereas FIG. 2 illustrates the vertical relationships of the gas inlets relative to one another and to the center lines of the wafer receiving areas, FIG. 3 illustrates the angular relationships of the gas inlets. That is, FIG. 3 illustrates the direction in which the gas inlets direct the flow of gas. FIG. 3 is a top view of the system shown in FIG. 1. The wafer receiving areas are shown holding wafers. Wafer receiving areas 42, 40 and 38 are on sides 20, 22 and 24, respectively.

The wafer receiving areas lie in respective planes defined by the sides. For example, receiving area 40 lies in a plane defined by side 22.

Gas tube 46 lies in a second plane, the second plane being parallel to the plane of receiving area 40. Gas tube 48 similarly lies in a place parallel to the plane of receiving area 40.

Arrowed lines 90 and 92 indicate the direction in which gas inlets 78 and 84 direct gas. Similarly, arrowed lines 94 and 96 indicate the direction in which gas inlets 98 and 100 direct gas. In the preferred embodiment, the direction of the gas inlets is intentionally aligned to avoid intersection with the corresponding wafer receiving area. For example, line 94 does not intersect area 42. Rather, line 94 passes midway between gas tube 44 and edge 30. Each gas inlet of the system is similarly directed to avoid intersection with its corresponding wafer receiving area, and to point in a direction midway between an edge and a neighboring gas tube. This arrangement has been found to further reduce the number of particles adhering to the semiconductor wafers during processing because it maximizes the distance that the gas flows before it hits anything in the chamber.

More specifically, in the preferred embodiment, the included angle between the gas inlets of a particular gas tube is 110 degrees. For example, the including angle 102, between lines 92 and 96, is 110 degrees. This angular relationship also defines the angle at which the line of a gas inlet and the plane of a side meet. For example, angle 104 is the angle at which the line 94 of gas inlet 98 meets the plane of side 20. In the preferred embodiment, this angle is five degrees.

In connection with gas tube 46, center line 106 indicates the line which bisects the angle included between the gas inlets of gas tube 46. In the preferred embodiment, when gas tube 46 is installed, center line 106 is aligned to edge 32. Specifically, as will be shown with reference to FIG. 4, an alignment slot is formed at the top end of gas tube 46. The slot is shaped to receive an alignment bar. The alignment bar is long enough to reach edge 32 while sitting in the alignment slot. During gas tube installation, the alignment bar is placed in the alignment slot and gas tube 46 is rotated until the alignment bar meets edge 32. Consequently, the gas tube, and therefore its' gas inlets, are easily aligned to achieve the geometric relationships shown in FIG. 3. It should be understood that each gas tube is installed in a similar manner.

Figure 4:
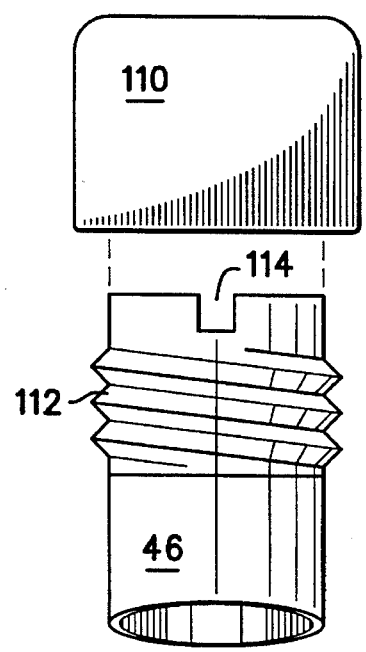
FIG. 4 is a side view of a first end of a preferred gas tube in accordance with the present invention.

FIG. 4 illustrates in more detail the first end which is the top end of representative gas tube 46. FIG. 4 shows threaded portion 112, register slot or alignment slot 114 and removable cap 110. Slot 114 is the slot referred to above, shaped to receive an alignment bar. Slot 114 is shown as symmetric. Alternatively, slot 114 could be shaped asymmetrically, to allow an alignment bar to extend in only one direction. This would prevent tube 46 from being aligned 180 degrees backwards.

Threaded portion 112 and tube 46 are hollow. Removable cap 110 provides a convenient means for cleaning gas tube 46. Conventional gas tubes had a permanent cap, making cleaning difficult. With a removable cap, a cleaning instrument can be passed through gas tube 46. Furthermore, the removable cap allows visual inspection of the inside of the tube.

In the preferred embodiment, threaded portion 112 is a separate threaded swage lock member which is attached to the top of gas tube 46. Removable cap 110 is a commercially available cap designed to fit the threaded swage lock portion

112. Alternatively, gas tube 46 may be threaded with a threading die, or other means well known in the industry.

The preferred gas tubes, represented by gas tube 46, comprise stainless steel tubing which has been electropolished. Preferably, the electropolishing is done following the drilling of the gas inlets in order to eliminate burrs inside the tubes.

By now it should be realized that an improved gas distribution system is provided by the present invention. The configuration of the system in accordance with the present invention decreases the number of microscopic particles settling on the semiconductor wafers being processed by arranging the direction and placement of gas inlets in a particularly advantageous manner. Furthermore, an improved gas distribution system is provided which can be conveniently aligned and cleaned.

We claim:

1. In a semiconductor wafer processing system, an improved gas distribution system comprising:

A wafer handling member comprising a side having a plurality of wafer receiving areas, the side also having a first long edge and second long edge;

a first gas tube corresponding to the first long edge, the first gas tube having a length and a first plurality of gas inlets corresponding to the side, the first plurality of gas inlets distributed along the first gas tube length;

a second gas tube corresponding to the second long edge, the second gas tube having a length and a second plurality of gas inlets corresponding to the side, the second plurality of gas inlets distributed along the second gas tube length; and wherein every inlet of the first plurality of gas inlets is offset from every inlet of the second plurality of gas inlets.

2. The system of claim 1, wherein the first plurality of gas inlets and the second plurality of gas inlets are directed along respective lines that avoid intersection with the plurality of wafer receiving areas.

3. The system of claim 2, wherein the respective lines along which the gas inlets are directed intersect a first plane defined by the side at an angle of 5 degrees.

4. The system of claim 1, wherein the first gas tube further comprises a removable cap covering a first end of the first gas tube.

5. The system of claim 4, wherein the first gas tube further comprises a register slot formed at the first end of the first gas tube.

6. The system of claim 1, wherein the first gas tube further comprises a register slot formed at a first end of the first gas tube.

* * * * *